US011158857B2

(12) United States Patent
Woo et al.

(10) Patent No.: US 11,158,857 B2
(45) Date of Patent: Oct. 26, 2021

(54) LITHIUM ELECTRODE AND LITHIUM SECONDARY BATTERY COMPRISING THE SAME

(71) Applicant: LG CHEM, LTD., Seoul (KR)

(72) Inventors: Kyung Hwa Woo, Daejeon (KR); Jeong Woo Shon, Daejeon (KR); Jong Keon Yoon, Daejeon (KR); Hoejin Hah, Daejeon (KR)

(73) Assignee: LG CHEM, LTD., Seoul (KR)

( * ) Notice: Subject to any disclaimer, the term of this patent is extended or adjusted under 35 U.S.C. 154(b) by 176 days.

(21) Appl. No.: 16/487,567

(22) PCT Filed: Aug. 14, 2018

(86) PCT No.: PCT/KR2018/009354
§ 371 (c)(1),
(2) Date: Aug. 21, 2019

(87) PCT Pub. No.: WO2019/103282
PCT Pub. Date: May 31, 2019

(65) Prior Publication Data
US 2019/0386315 A1  Dec. 19, 2019

(30) Foreign Application Priority Data

Nov. 24, 2017 (KR) .................. 10-2017-0158497
Aug. 13, 2018 (KR) .................. 10-2018-0094525

(51) Int. Cl.
| | |
|---|---|
| *H01M 4/62* | (2006.01) |
| *H01M 4/04* | (2006.01) |
| *H01M 4/134* | (2010.01) |
| *H01M 4/36* | (2006.01) |
| *H01M 10/052* | (2010.01) |
| *H01M 4/38* | (2006.01) |
| *H01M 10/42* | (2006.01) |
| *H01M 4/1395* | (2010.01) |
| *C23C 14/08* | (2006.01) |
| *C23C 14/06* | (2006.01) |

(52) U.S. Cl.
CPC ......... *H01M 4/628* (2013.01); *H01M 4/0423* (2013.01); *H01M 4/134* (2013.01); *H01M 4/1395* (2013.01); *H01M 4/366* (2013.01); *H01M 4/382* (2013.01); *H01M 10/052* (2013.01); *H01M 10/4235* (2013.01); *C23C 14/0605* (2013.01); *C23C 14/081* (2013.01)

(58) Field of Classification Search
None
See application file for complete search history.

(56) References Cited

U.S. PATENT DOCUMENTS

| | | | |
|---|---|---|---|
| 2003/0129497 A1* | 7/2003 | Yamamoto | H01M 4/38 429/246 |
| 2009/0155697 A1* | 6/2009 | Park | H01M 10/0525 429/339 |
| 2009/0325063 A1 | 12/2009 | Albano et al. | |
| 2011/0111290 A1 | 5/2011 | Uchida et al. | |
| 2011/0212268 A1 | 9/2011 | Albano et al. | |
| 2011/0217578 A1 | 9/2011 | Albano et al. | |
| 2013/0309571 A1 | 11/2013 | Yoon et al. | |
| 2015/0162602 A1 | 6/2015 | Dadheech et al. | |
| 2016/0013462 A1 | 1/2016 | Cui et al. | |
| 2016/0204408 A1 | 7/2016 | Herle | |
| 2017/0062829 A1 | 3/2017 | Ryu et al. | |
| 2017/0263935 A1* | 9/2017 | Kozen | H01M 10/05 |
| 2017/0294848 A1 | 10/2017 | Burshtain et al. | |
| 2019/0386315 A1 | 12/2019 | Woo et al. | |

FOREIGN PATENT DOCUMENTS

| | | |
|---|---|---|
| CN | 102089905 A | 6/2011 |
| CN | 104701487 A | 6/2015 |
| CN | 209329034 U | 8/2019 |
| EP | 3136475 A1 | 3/2017 |
| EP | 3 537 516 A1 | 11/2019 |
| JP | H-6-36800 A | 2/1994 |
| JP | 2003-077461 A | 3/2003 |
| JP | 2009-140648 A | 6/2009 |
| JP | 2011-525292 A | 9/2011 |

(Continued)

OTHER PUBLICATIONS

Cheng et al. "Toward Safe Lithium Metal Anode in Recharqesble Batteries: A Review," Chemical Reviews, (Downloaded via State Intellectual Property Office dated Nov. 22, 2019), vol. 117, Jul. 22, 2017. pp. 10403-10473.

(Continued)

*Primary Examiner* — Robert S Carrico
(74) *Attorney, Agent, or Firm* — Birch, Stewart, Kolasch & Birch, LLP

(57) ABSTRACT

A lithium electrode including: a lithium metal layer; an aluminum oxide layer on the lithium metal layer; and a carbon layer on the aluminum oxide layer, and a lithium secondary battery including the same. The aluminum oxide layer can prevent a direct reaction between a non-aqueous electrolyte and a lithium metal layer, and particularly, since the aluminum oxide layer does not have electrical conductivity, lithium deposition occurs between the lithium metal layer and aluminum oxide layer. Thus lithium metal is not deposited on the protection layer. In addition, the carbon layer functions for producing a stable solid electrolyte interface film thereon.

7 Claims, 1 Drawing Sheet

(56) References Cited

FOREIGN PATENT DOCUMENTS

KR   10-2013-0128273 A   11/2013
KR       10-1755121 B1    7/2017

OTHER PUBLICATIONS

European Search Report dated Mar. 16, 2020 for EP Application No. 18881240.8.
International Search Report for PCT/KR2018/009354 (PCT/ISA/210) dated Mar. 12, 2019, with English translation.
Kazyak et al., "Improved Cycle Life and Stability of Lithium Metal Anodes through Ultrathin Atomic Layer Deposition Surface Treatments", Chemistry of Materials, vol. 27, No. 18, 2015, 7 pages.
Kozen et al., "Next-Generation Lithium Metal Anode Engineering via Atomic Layer Deposition", ACS Nano, vol. 9, No. 6, 2015, pp. 5884-5892.
Lin et al., "Reviving the lithium metal anode for high-energy batteries", Nature Nanotechnology, vol. 12, Mar. 7, 2017, pp. 194-206.
Wang et al., "Long lifespan lithium metal anodes enabled by Al2O3 sputter coating", Energy Storage Materials, vol. 10, 2018, pp. 16-23.
Zhang et al., "A carbon-based 3D current collector with surface protection for Li metal anode", Nano Research, vol. 10, No. 4, 2017, pp. 1356-1365.

\* cited by examiner

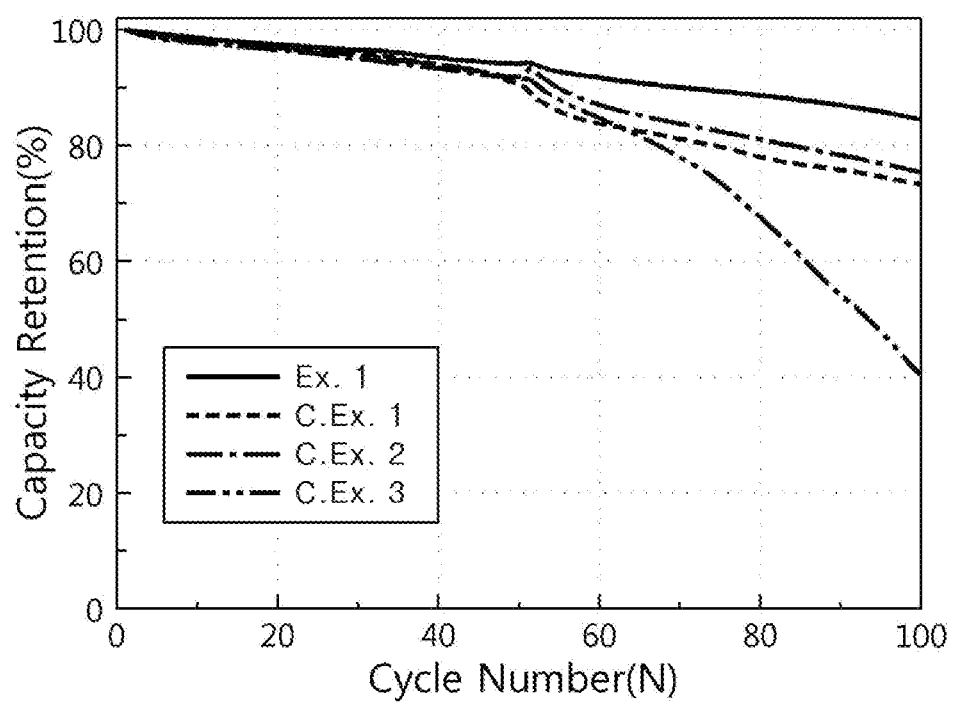

LITHIUM ELECTRODE AND LITHIUM SECONDARY BATTERY COMPRISING THE SAME

CROSS-REFERENCE TO RELATED APPLICATIONS

This application claims the benefit of Korean Patent Application No. 10-2017-0158497 filed on Nov. 24, 2017 and Korean Patent Application No. 10-2018-0094525 filed on Aug. 13, 2018 with the Korean Intellectual Property Office, the disclosures of which are herein incorporated by reference in their entirety.

TECHNICAL FIELD

The present invention relates to a lithium electrode and a lithium secondary battery including the same, and more specifically, to a lithium electrode that can improve cycle performance of a lithium secondary battery and a lithium secondary battery including the same.

BACKGROUND ART

With the rapid development of electrical, electronic, communication, and computer industries, a demand for high capacity batteries is increasing. Thus, as an anode having high energy density, a lithium metal secondary battery using a lithium metal or lithium alloy as an anode is receiving attention.

A lithium metal secondary battery is a secondary battery using a lithium metal or lithium alloy as an anode. The lithium metal has low density of 0.54 g/cm$^3$ and very low standard reduction potential of −3.045 V (SHE: based on standard hydrogen electrode), and thus, is receiving the most attention as an electrode material.

When a lithium metal is used as an anode, the lithium metal reacts with impurities, lithium salts of an electrolyte, water, an organic solvent, etc. to form a solid electrolyte interface (SEI). Since it is repeatedly produced and extinguished as charge/discharge of lithium metal repeatedly occurs, the formed SEI is cracked or broken, and becomes unstable.

Further, since the lithium metal has very strong reactivity, it continuously reacts with the electrolyte to deteriorate the cycle performance of batteries.

DISCLOSURE

Technical Problem

Accordingly, it is an object of the present invention to provide a lithium electrode that can produce a stable SEI, and prevent a direct reaction between a non-aqueous electrolyte and a lithium metal layer, thereby improving the cycle performance of a lithium secondary battery, and a lithium secondary battery including the same.

Technical Solution

A lithium electrode according to one aspect of the present invention includes: a lithium metal layer; an aluminum oxide (i.e., Al$_2$O$_3$) layer on the lithium metal layer; and a carbon layer on the aluminum oxide layer.

Here, the thickness of the aluminum oxide layer may be 20 nm to 100 nm, or 30 nm to 90 nm.

Further, the thickness of the may be 10 nm to 50 nm.

Meanwhile, the lithium electrode of the present invention may further include a solid electrolyte interface film on the carbon layer.

The thickness of the lithium metal layer may be 10 μm to 300 μm.

The aluminum oxide layer or carbon layer may be formed by physical vapor deposition.

Here, the physical vapor deposition may be thermal evaporation, e-beam evaporation, or sputtering.

A lithium secondary battery according to another aspect of the present invention includes an electrode assembly including the above-explained lithium electrode as an anode, a cathode, and a separator interposed between the anode and cathode, and a non-aqueous electrolyte that impregnates the electrode assembly.

Effects of the Invention

The present invention is characterized by including a protection layer wherein an aluminum oxide layer and a carbon layer are sequentially deposited on a lithium metal layer, and such an aluminum oxide layer can prevent a direct reaction between a non-aqueous electrolyte and a lithium metal layer.

Particularly, since the aluminum oxide layer does not have electrical conductivity, lithium deposition occurs between the lithium metal layer and the aluminum oxide layer, and thus the lithium metal is not deposited on the protection layer.

Further, the carbon layer produces a stable SEI film.

DESCRIPTION OF DRAWING

The drawing attached hereto illustrates preferable examples of the present invention, but the present invention should not be limited to the description of the drawing.

The Figure is a graph showing capacity retention over the cycle progression of batteries manufactured according to examples and comparative examples.

BEST MODE

Hereinafter, the present invention will be explained in detail with reference to the Figure. The terms or words used in the specification and claims should not be interpreted as being limited to common or dictionary meanings, and should be interpreted as having meanings and concepts corresponding to the technical idea of the present invention, based on the principle that the inventors can appropriately define the concept of the term so as to explain their own invention in the best way.

Thus, the constructions described in examples of the specification and the Figure are no more than most preferable examples of the present invention, and various equivalents and modifications that can replace the same at the time of filing of the present invention may exist.

The lithium electrode according to one aspect of the present invention includes: a lithium metal layer; an aluminum oxide (Al$_2$O$_3$) layer formed on the lithium metal layer; and a carbon layer formed on the aluminum oxide (Al$_2$O$_3$) layer.

Since a lithium metal has very strong reactivity, it may react with a non-aqueous electrolyte in a battery to deteriorate cycle performance of the battery, but the aluminum oxide layer prevents a direct reaction between the non-aqueous electrolyte and a lithium metal layer, thus preventing deterioration of the cycle performance of the battery.

Meanwhile, during a charge reaction, an electrolyte decomposition reaction occurs on the surface of an anode because the reduction potential of the electrolyte is relatively higher than the potential of lithium. Such an electrolyte decomposition reaction forms a solid electrolyte interface (SEI) on the surface of an electrode and inhibits electron transfer required in the reaction between the anode and the electrolyte, thereby preventing additional decomposition of the electrolyte. However, in the case of a battery using a lithium metal as an anode, once formed, the SEI repeats production and extinction as charge/discharge of lithium metal progresses, and thus the produced SEI layer is cracked or broken and becomes unstable. Further, since a lithium metal has a very strong reactivity, it continuously reacts with the electrolyte and deteriorates the cycle performance of a battery. However, if a carbon layer is applied as a protection layer as in the present invention, once produced, the SEI layer maintains its shape, thereby preventing continuous reaction with the electrolyte and improving battery performance.

Particularly, since the aluminum oxide layer does not have electrical conductivity, electrons generated in the lithium metal layer do not move to the aluminum oxide layer. Thus, between the lithium metal layer and the aluminum oxide layer, lithium ions and electrons meet and lithium metal is deposited. That is, a lithium metal is not deposited on the aluminum oxide layer or on the carbon layer. When a lithium metal is deposited on the aluminum oxide layer, an internal short circuit of a battery may be generated, and dead lithium may be formed, and since an electrode protection layer cannot prevent a reaction with the electrolyte, the electrolyte and lithium metal are consumed to deteriorate battery performance, but the present invention can overcome such problems because a lithium metal is not deposited on the aluminum oxide layer.

Here, the thickness of the aluminum oxide layer may be 20 to 100 nm, 30 to 90 nm, or 40 to 80 nm. If the thickness of the aluminum oxide layer is less than 20 nm, it is difficult to form a uniform protection layer and a lithium metal may be deposited on the protection layer, which is not preferable. Further, if the thickness is greater than 100 nm, electrical resistance may excessively increase, which it not preferable.

The thickness of the carbon layer may be 10 to 50 nm, or 20 to 40 nm. If the thickness of the carbon layer is less than 10 nm, it is difficult to form a uniform protection layer, and if it is greater than 50 nm, although an increase in resistance may not be significant, the deposition process cost may increase, which is not preferable.

Meanwhile, an SEI film formed on a lithium metal layer on which a protection layer is not formed is soft, and thus it may be easily cracked or broken by plating or stripping of the lithium metal layer and may be unstable, but in the present invention, since a protection layer including an aluminum oxide layer and a carbon layer is formed on a lithium metal layer, a lithium metal is not deposited on the protection layer, and thus the SEI film formed on the protection layer may remain stable.

Further, the lithium metal layer of the present invention is a plate-type metal, the width may be controlled according to the shape of an electrode so as to facilitate electrode manufacture, and the thickness of the lithium metal layer may be 10 to 300 µm, 20 to 200 µm, or 20 to 100 µm.

The method of forming the aluminum oxide layer or carbon layer is not specifically limited, but for example, it may be formed by physical vapor deposition (PVD). Here, the physical vapor deposition (PVD) may include thermal evaporation, e-beam evaporation, or sputtering, and preferably, sputtering deposition may be used. The sputtering deposition has advantages in that the cost is low, and it is possible to form a uniform thin protection film on a lithium metal layer.

According to another aspect of the present invention, a lithium secondary battery is provided that includes an electrode assembly including the above-explained lithium electrode according to the present invention as an anode, a cathode, and a separator interposed between the anode and cathode, and a non-aqueous electrolyte for impregnating the electrode assembly.

The cathode may consist of a cathode current collector and a cathode active material layer coated on one or both sides of the cathode current collector. Non-limiting examples of the cathode current collector include foils prepared from aluminum, nickel, or a combination thereof, and the cathode active materials included in the cathode active material layer may be one selected from the group consisting of $LiCoO_2$, $LiNiO_2$, $LiMn_2O_4$, $LiCoPO_4$, $LiFePO_4$, $LiNiMnCoO_2$, and $LiNi_{1-x-y-z}Co_xM1_yM2_zO_2$ (where M1 and M2 are each independently one selected from the group consisting of Al, Ni, Co, Fe, Mn, V, Cr, Ti, W, Ta, Mg, and Mo, x, y, and z are each independently an atomic fraction of the elements constituting the oxide where $0 \le x < 0.5$, $0 \le y < 0.5$, $0 \le z < 0.5$, and $x+y+z \le 1$), or a mixture of two or more kinds thereof.

The cathode active material layer may further include conductive additives so as to improve electrical conductivity. Here, the conductive additives are not specifically limited as long as they are electrically conductive materials that do not cause a chemical change in a lithium secondary battery. In general, carbon black, graphite, carbon fiber, carbon nanotubes, a metal powder, a conductive metal oxide, an organic conductive material, etc. may be used, and currently commercially available products may include acetylene black series (products from Chevron Chemical Company, Gulf Oil Company, etc.), Ketjen Black EC series (products from (Armak Company), Vulcan XC-72 (a product from Cabot Company), and Super P (a product from MMM Company), etc. For example, acetylene black, carbon black, graphite, etc. may be used.

As a binder that maintains the cathode active material on the cathode current collector and connects between active materials, various kinds of binders such as polyvinylidene fluoride-hexafluoropropylene (PVDF-co-HFP), polyvinylidene fluoride (PVDF), polyacrylonitrile, polymethyl methacrylate, styrene butadiene rubber (SBR), carboxyl methyl cellulose (CMC), etc. may be used.

The separator may consist of a porous polymer substrate, and as the porous polymer substrate, any one commonly used in lithium secondary batteries may be used, and for example, a polyolefin-based porous membrane or non-woven fabric may be used, but is not limited thereto.

Examples of the polyolefin-based porous membrane may include membranes formed of polyolefin-based polymers such as a polyethylene such as high density polyethylene, linear low density polyethylene, low density polyethylene, ultra high molecular weight polyethylene, polypropylene, polybutylene, polypentene, etc. alone or in combinations.

As the non-woven fabric, besides a polyolefin-based non-woven fabric, for example, non-woven fabrics formed of polyethylene terephthalate, polybutylene terephthalate, polyester, polyacetal, polyamide, polycarbonate, polyimide, polyetheretherketone, polyethersulfone, polyphenylene oxide, polyphenylene sulfide and polyethylene naphthalate, etc. alone or in combinations may be used. The non-woven fabric may be a spun-bond non-woven fabric or a melt blown non-woven fabric consisting of long fibers.

The thickness of the porous polymer substrate is not specifically limited, but it may be 1 μm to 100 μm, or 5 μm to 50 μm.

The size of pores existing in the porous polymer substrate and the porosity are not specifically limited, but may be 0.001 μm to 50 μm and 10% to 95%, respectively.

The electrolyte salt included in the non-aqueous electrolyte that can be used in the present invention is a lithium salt. As the lithium salt, those commonly used in an electrolyte for a lithium secondary battery can be used without limitations. For example, the anion of the lithium salt may be one or more selected from the group consisting of $F^-$, $Cl^-$, $Br^-$, $I^-$, $NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$, and $(CF_3CF_2SO_2)_2N^-$.

As the organic solvent included in the non-aqueous electrolyte, those commonly used in an electrolyte for a lithium secondary battery can be used without limitations, and for example, ether, ester, amide, linear carbonate, cyclic carbonate, etc. may be used alone or in combinations of two or more kinds.

Among them, representatively, cyclic carbonates, linear carbonates, or a mixture thereof may be used.

Specifically examples of the cyclic carbonates may include ethylene carbonate (EC), propylene carbonate (PC), 1,2-butylene carbonate, 2,3-butylene carbonate, 1,2-pentylene carbonate, 2,3-pentylene carbonate, vinylene carbonate, vinylethylene carbonate, halogenated products thereof, and a mixture thereof. The halogenated products thereof may include, for example, fluoroethylene carbonate (FEC), etc. but are not limited thereto.

Specific examples of the linear carbonate may include dimethyl carbonate (DMC), diethyl carbonate (DEC), dipropyl carbonate, ethyl methyl carbonate (EMC), methylpropyl carbonate, ethylpropyl carbonate, and mixtures thereof, but are not limited thereto.

Particularly, among the carbonate-based organic solvents, cyclic carbonates of ethylene carbonate and propylene carbonate are organic solvents with high viscosity and high dielectricity, and thus can better dissociate lithium salts in an electrolyte, and if such cyclic carbonate is mixed with a low viscosity, low dielectricity linear carbonate such as dimethyl carbonate and diethyl carbonate at an appropriate ratio, an electrolyte with higher electrical conductivity may be formed.

Among the organic solvents, as the ether, one selected from the group consisting of dimethyl ether, diethyl ether, dipropyl ether, methylethyl ether, methylpropyl ether, ethylpropyl ether, or mixtures thereof may be used, but is not limited thereto.

Among the organic solvents, as the ester, one selected from the group consisting of methyl acetate, ethyl acetate, propyl acetate, methyl propionate, ethyl propionate, propyl propionate, γ-butyrolactone, γ-valerolactone, γ-caprolactone, σ-valerolactone, ε-caprolactone, or mixtures thereof may be used, but is not limited thereto.

The introduction of the non-aqueous electrolyte may be conducted at an appropriate step during the preparation process of a lithium secondary battery, according to the preparation process and required properties of the final product. That is, it may be applied before the assembly of a lithium secondary battery, in the final assembly step of a lithium secondary battery, etc.

For the lithium secondary battery according to the present invention, the processes of lamination, stacking, and folding of a separator and an electrode may be applied. Further, the electrode case may have a cylindrical, square, pouch, or coin shape, etc.

Hereinafter, the present invention will be explained in detail with reference to the following examples. However, these examples can be modified to various forms, and the scope of the present invention should not be interpreted as being limited to the examples described below. The examples of the present invention are provided for better understanding of the present invention by one of ordinary knowledge in the art.

1. EXAMPLE 1

(1) Preparation of a Cathode

A cathode active material slurry consisting of 95 wt % of $LiNi_{1/3}Mn_{1/3}Co_{1/3}O_2$ as a cathode active material, 2.5 wt % of Super P as a conductive material, and 2.5 wt % of polyvinylidene fluoride(PVDF) as a binder was prepared, and then the cathode active material slurry was coated on an aluminum current collector and dried to prepare a cathode.

(2) Preparation of an Anode

On a lithium metal layer with a thickness of 40 μm, an aluminum oxide layer and a carbon layer were sequentially deposited by sputtering deposition to prepare an anode. Here, for the sputtering, equipment manufactured by SNTEK Co. Ltd. was used, and as the aluminum oxide and graphite raw materials, products from RND Korea were used.

The sputtering conditions are as shown in Table 1, and deposition was repeated twice, the deposition of the aluminum oxide layer was conducted for a total of 20 minutes, and the deposition of the carbon layer was conducted for a total of 40 minutes. The total thickness of the prepared aluminum oxide layer and carbon layer was measured to be 34.0 nm, and the surface roughness was measured to be 0.69 nm.

TABLE 1

| Deposited material | Type of Power | Raw material | Power (W) | Deposition time (min) | Gas (Ar, cm³/min) | Pressure (mTorr) |
|---|---|---|---|---|---|---|
| $Al_2O_3$ | RF | $Al_2O_3$ | 350 | 10 | 40 | 10 |
| Carbon | RF | Graphite | 200 | 20 | 40 | 10 |

(3) Preparation of a Lithium Secondary Battery

An electrode assembly formed by interposing a separator (on both sides of a polyethylene porous polymer substrate, a porous coating layer formed of a mixture of alumina and a PVDF binder was formed) between the above prepared cathode and anode was inserted into a pouch-type battery case, and then a non-aqueous electrolyte (1 M $LiPF_6$, VC 1 wt %, FEC:EMC=3:7 (volume ratio)) was injected into the battery case, which was then completely sealed to prepare a lithium secondary battery.

2. COMPARATIVE EXAMPLE 1

A lithium secondary battery was manufactured by the same method as Example 1, except that as an anode, one prepared by depositing a carbon layer on a lithium metal layer having a thickness of 40 μm for 1 hour through sputtering deposition was used. For reference, the thickness of the carbon layer was measured to be 25.2 nm, and the surface roughness was measured to be 0.37 nm.

3. COMPARATIVE EXAMPLE 2

A lithium secondary battery was manufactured by the same method as Example 1, except that as an anode, one prepared by depositing an aluminum oxide layer on a lithium metal layer having a thickness of 40 μm for 1 hour through sputtering deposition was used. For reference, the thickness of the aluminum oxide layer was measured to be 64.5 nm, and the surface roughness was measured to be 0.29 nm.

4. COMPARATIVE EXAMPLE 3

A lithium secondary battery was manufactured by the same method as Example 1, except that as an anode, a lithium metal layer having a thickness of 40 μm was used.

5. MEASUREMENT OF CAPACITY RETENTION OF LITHIUM SECONDARY BATTERIES

For the lithium secondary batteries prepared in the example and comparative examples, while repeating charging at a 0.3 C current density and discharging at a 0.5 C current density, the capacity retention of the batteries according to the cycle number of the batteries were measured, and is shown in the Figure.

Referring to the Figure, it can be seen that in the case of the example and comparative examples, the capacity retention decreased similarly until 40 cycles, but thereafter, until 100 cycles, in the comparative examples, capacity retention decreased to less than 80%, and particularly, in Comparative Example 3 wherein no protection layer was formed on a lithium metal layer, capacity retention was measured to be about 40%.

6. MEASUREMENT OF CAPACITY RETENTION ACCORDING TO THICKNESS OF ALUMINUM OXIDE LAYER AND CARBON LAYER

In order to confirm the influence of each thickness of the aluminum oxide layer and carbon layer on the capacity of a lithium secondary battery, lithium secondary batteries were manufactured by the same method as Example 1, except that anodes prepared with changes in the thicknesses of the aluminum oxide layer and carbon layer were used.

For the manufactured lithium secondary batteries, while repeating charging at a 0.3 C current density and discharging at a of 0.5 C current density, the capacity retention of the batteries according to the cycle number was measured, and the cycle number when the capacity retention was 80% was measured, and is shown in the following Table 2.

TABLE 2

| | | Thickness of carbon layer | | | | | |
|---|---|---|---|---|---|---|---|
| | | 0 nm | 5 nm | 10 nm | 30 nm | 50 nm | 70 nm |
| Thickness of aluminum oxide layer | 0 nm | 64 cycles | — | 70 cycles | 75 cycles | 73 cycles | — |
| | 20 nm | — | 83 cycles | 100 cycles | 115 cycles | 105 cycles | 85 cycles |
| | 60 nm | 81 cycles | 85 cycles | 110 cycles | 120 cycles | 115 cycles | 88 cycles |
| | 100 nm | — | 81 cycles | 94 cycles | 90 cycles | 90 cycles | 80 cycles |
| | 140 nm | — | — | 72 cycles | 70 cycles | 65 cycles | — |

Referring to Table 2, when the thickness of the aluminum oxide layer satisfied 20 to 100 nm and simultaneously the thickness of the carbon layer satisfied 10 to 50 nm, the cycle number when the capacity retention was 80% was measured to be 90 or more, thus confirming that excellent capacity retention is exhibited when the above thickness ranges are satisfied.

The foregoing descriptions are no more than illustrative explanations of the technical idea of the present invention, and various modifications and changes can be made by one of ordinary knowledge in the art without departing from the essential characteristics of the present invention. Therefore, examples described in the specification are not intended to limit the technical idea of the present invention but are intended to explain, and the scope of the present invention is not limited thereby. The scope of the protection of the present invention should be interpreted by the claims below, and all the technical ideas within the equivalent range should be interpreted to be included in the scope of the right of the present invention.

The invention claimed is:
1. A lithium electrode comprising:
a lithium metal layer;
an aluminum oxide layer on the lithium metal layer; and
a carbon layer on the aluminum oxide layer,
wherein a thickness of the aluminum oxide layer is 20 nm to 100 nm, and a thickness of the carbon layer is 10 nm to 50 nm.
2. The lithium electrode according to claim 1, wherein a thickness of the aluminum oxide layer is 30 nm to 90 nm.

3. The lithium electrode according to claim 1, further comprising a solid electrolyte interface film on the carbon layer.

4. The lithium electrode according to claim 1, wherein a thickness of the lithium metal layer is 10 µm to 300 µm.

5. The lithium electrode according to claim 1, wherein the aluminum oxide layer or carbon layer is formed by physical vapor deposition.

6. The lithium electrode according to claim 5, wherein the physical vapor deposition is thermal evaporation, e-beam evaporation, or sputtering.

7. A lithium secondary battery comprising:
- an electrode assembly comprising the lithium electrode according to claim 1 as an anode, a cathode, and a separator interposed between the anode and cathode; and
- a non-aqueous electrolyte that impregnates the electrode assembly.

* * * * *